(12) United States Patent
Lerner et al.

(10) Patent No.: US 11,809,772 B1
(45) Date of Patent: Nov. 7, 2023

(54) SYSTEMS AND METHODS FOR DETECTION STATUS OF INTERCOM TERMINATION

(71) Applicant: H.M. Electronics, Inc., Carlsbad, CA (US)

(72) Inventors: Victor Lerner, Carlsbad, CA (US); Charles Butten, Richmond, CA (US)

(73) Assignee: H.M. Electronics, Inc., Carlsbad, CA (US)

( * ) Notice: Subject to any disclaimer, the term of this patent is extended or adjusted under 35 U.S.C. 154(b) by 0 days.

(21) Appl. No.: 18/343,527

(22) Filed: Jun. 28, 2023

(51) Int. Cl.
*G06F 3/16* (2006.01)

(52) U.S. Cl.
CPC ................... *G06F 3/162* (2013.01)

(58) Field of Classification Search
CPC ................. G06F 3/162; G06F 3/165
See application file for complete search history.

(56) References Cited

U.S. PATENT DOCUMENTS

2010/0082846 A1\* 4/2010 Kim ............... G06F 13/426
710/63

2020/0194863 A1 6/2020 Bennett
2022/0191634 A1\* 6/2022 Khelfa ................ G01R 31/11
2022/0321241 A1 10/2022 Bennett

FOREIGN PATENT DOCUMENTS

WO WO-9716013 A1 \* 5/1997 ............. H04M 1/82

\* cited by examiner

*Primary Examiner* — Fan S Tsang
*Assistant Examiner* — David Siegel
(74) *Attorney, Agent, or Firm* — ESPLIN & ASSOCIATES, PC

(57) ABSTRACT

Systems and methods for detecting detect termination status in an audio communication system, wherein termination status indicates whether exactly one termination circuit is part of the audio communication system, are disclosed. Exemplary implementations may: accept an input voltage, by a voltage-controlled current source that includes and drives a resistive load; generate an AC voltage used as an input voltage for the current source; connect a first set of one or more filters to the output of the current source that generate a first analog output signal; connect a second set of one or more filters to the resistive load that generate a second analog output signal; determine a ratio of the first and second analog output signals and use it to determine the termination status.

20 Claims, 4 Drawing Sheets

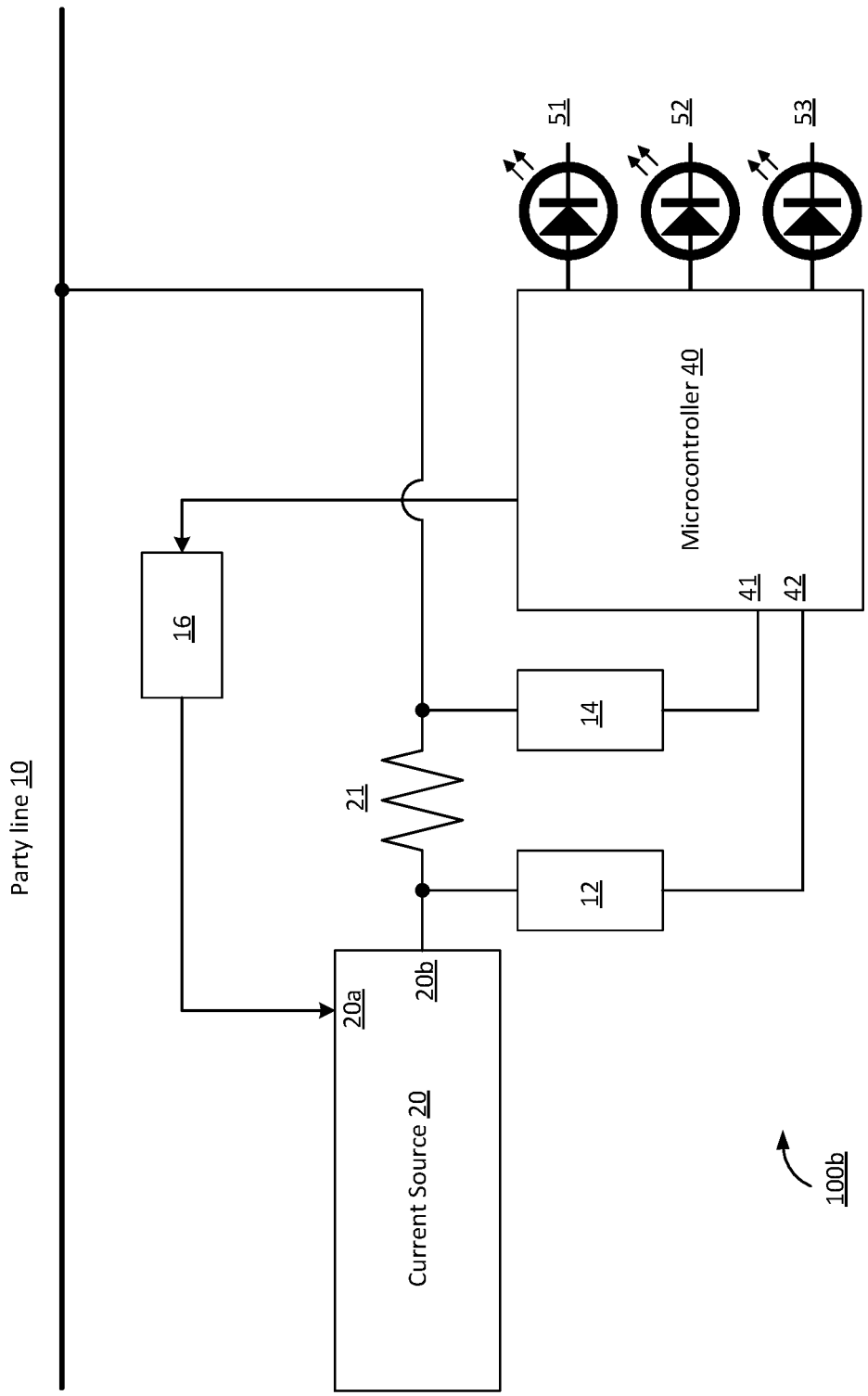

SYSTEMS AND METHODS FOR DETECTION STATUS OF INTERCOM TERMINATION

FIELD OF THE DISCLOSURE

The present disclosure relates to systems and methods for detecting the status of termination in an audio communication system between users, particularly in the context of wired multi-user intercom systems such as party lines.

BACKGROUND

Audio communication systems, e.g., intercom systems, for multi-user communications are known, such as party lines. Termination circuits for party lines are known. Crosstalk in (wired) audio communication systems is known.

SUMMARY

One aspect of the present disclosure relates to a system configured to detect termination status in an audio communication system. The termination status indicates whether exactly one termination circuit is part of a channel of the audio communication system. The system may include a voltage-controlled current source such as a Howland Current Source (or other current source), an alternating current generator, a first set of one or more filters, a second set of one of more filters, one or more circuitries, and/or other components. The system may be configured to accept an input voltage, by the voltage-controlled Current Source (CS) that includes and drives the party line through a resistive load. The system may be configured to generate an AC voltage used as an input voltage for the Current Source. The system may be configured to connect a first set of one or more filters to the output of the Current Source that generate a first analog output signal. The system may be configured to connect a second set of one or more filters to the resistive load that generate a second analog output signal. The system may be configured to determine a ratio of the first and second analog output signals and use it to determine the termination status, as well as perform one or more other steps.

Another aspect of the present disclosure relates to a method for detecting termination status in an audio communication system. The termination status indicates whether exactly one termination circuit is part of a channel of the audio communication system. The method may be implemented by a system that include one or more of a voltage-controlled current source such as a Howland Current Source (or other current source), an alternating current generator, a first set of one or more filters, a second set of one of more filters, one or more circuitries, and/or other components. The method may include accepting an input voltage, by the voltage-controlled Current Source (CS) that includes and drives the party line through a resistive load. The method may include generating an AC voltage used as an input voltage for the Current Source. The method may include connecting a first set of one or more filters to the output of the Current Source that generate a first analog output signal. The method may include connecting a second set of one or more filters to the resistive load that generate a second analog output signal. The method may include determining a ratio of the first and second analog output signals and using it to determine the termination status, as well as perform one or more other steps.

As used herein, any association (or relation, or reflection, or indication, or correspondence) involving communication devices, current sources, voltage generators, filters, circuitries, headsets, ear buds, microphones, loudspeakers, channels, sounds, signals, ports, connectors, conductors, instructions, and/or another entity or object that interacts with any part of the system and/or plays a part in the operation of the system, may be a one-to-one association, a one-to-many association, a many-to-one association, and/or a many-to-many association or "N"-to-"M" association (note that "N" and "M" may be different numbers greater than 1).

As used herein, the term "obtain" (and derivatives thereof) may include active and/or passive retrieval, determination, derivation, transfer, upload, download, submission, and/or exchange of information, and/or any combination thereof. As used herein, the term "effectuate" (and derivatives thereof) may include active and/or passive causation of any effect, both local and remote. As used herein, the term "determine" (and derivatives thereof) may include measure, calculate, compute, estimate, approximate, generate, and/or otherwise derive, and/or any combination thereof. As used herein, the terms "connect" and "couple" (and derivatives thereof) may be used interchangeably to indicate a link between multiple components that may or may not include intermediary components.

These and other features, and characteristics of the present technology, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

BRIEF DESCRIPTION OF THE DRAWINGS

FIG. 1B illustrates a system to detect termination status in an audio communication system, in accordance with one or more implementations.

DETAILED DESCRIPTION

Figure 1A:
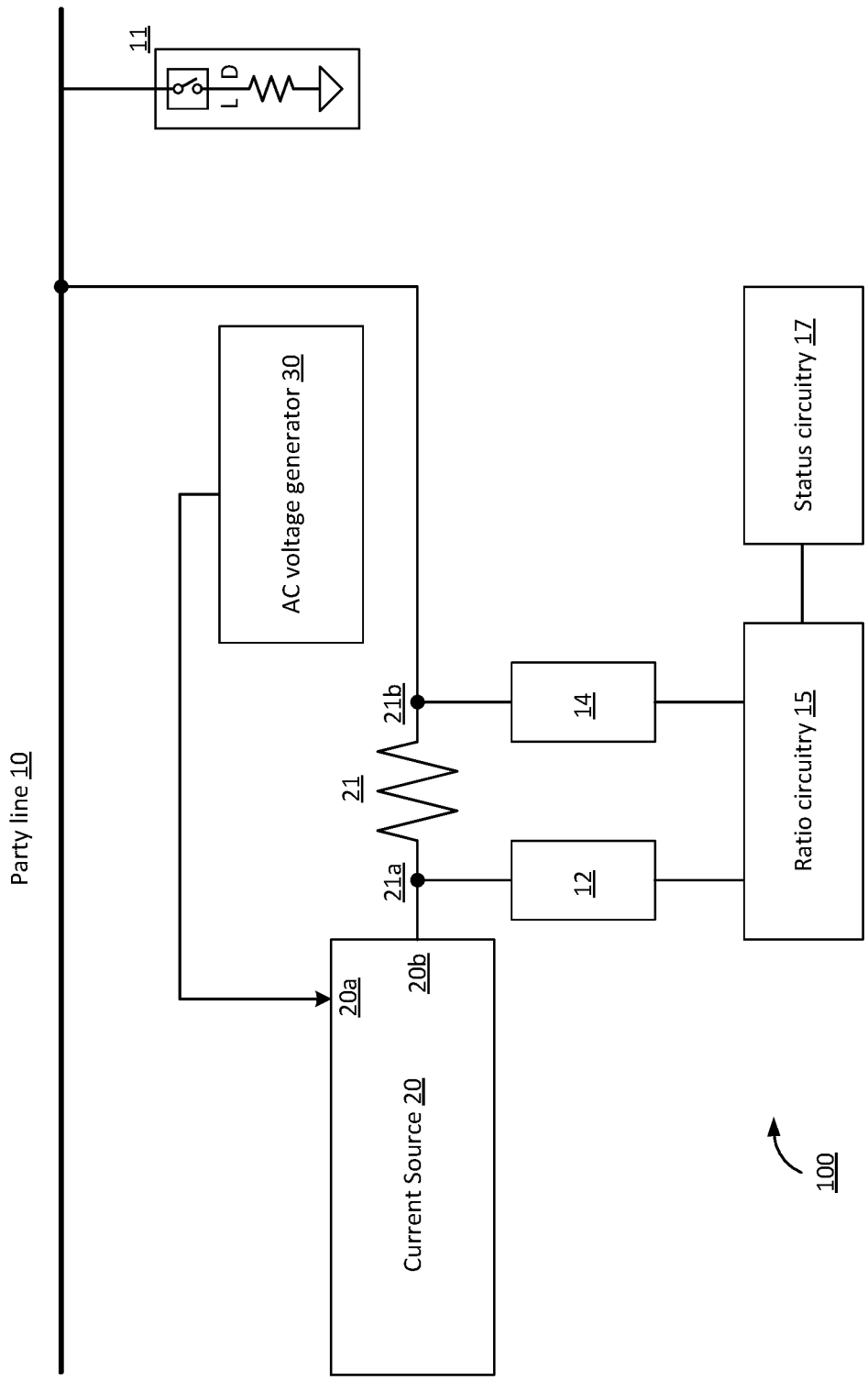
FIG. 1A illustrates a system to detect termination status in an audio communication system, in accordance with one or more implementations.

FIG. 1A illustrates a system 100 configured to detect termination status in an audio communication system for audio communications between users. The termination status may indicate whether exactly one termination circuit 11 is part of party line 10 (or connected to party line 10). Party line 10 may be part of a wired multi-user intercom system (on which multiple users can communicate using so-called user stations). In some implementations, two or more party lines 10 may be incorporated into an audio communication system having a first full-duplex audio channel, a second full-duplex audio channel, and so forth. Party line communications using more than two channels are envisioned within the scope of this disclosure. Audio communication systems may perform better (in terms of one or more of audio quality, signal-to-noise ratio, background noise, crosstalk between channels, and/or other audio characteristics) when exactly one termination circuit is included and active per party line, compared to zero, two, or more than two termination circuits.

The users of audio communication systems may include, by way of non-limiting example, employees, staff members or crew members, managers and/or other stakeholders, and/or other groups of people interacting and/or otherwise working together. Audio communication systems may be used in many (professional) contexts where people work together, including but not limited to restaurants, audio-visual production teams, performing arts communications, theme park ride management, construction sites, medical operating room communications, football coach and other athletic-related communications, factory floor communications, and/or other contexts.

System 100 may include one or more of a Current Source (CS) 20 (e.g., a voltage-controlled Current Source) that includes a resistive load 21, an alternating current (AC) generator 30, a first set of one or more filters 12, a second set of one of more filters 14, a ratio circuitry 15, a status circuitry 17, a microcontroller 40, a filter 16, one or more light-emitting diodes (LEDs) such as LEDs 51-52-53, and/or other components. Resistive load 21 may include a resistor. In some implementations, resistive load 21 may be a resistor-capacitor (RC) circuit. As used herein, the term "resistive load" does not require a purely resistive load, but may refer to resistive and capacitive load.

Current Source 20 may be configured to deliver a current through resistive load 21 that is based on an input voltage on input 20*a*. Input 20*a* may accept an input voltage, e.g., from alternating current voltage generator 30. Resistive load 21 may have a first connection 21*a* and a second connection 21*b*. Current Source 20 may be configured to create a voltage differential between first connection 21*a* and second connection 21*b* of resistive load 21. Output 20*b* of Current Source 20 may be connected to first connection 21*a*. Second connection 21*b* may be connected to party line 10. In some implementations, second connection 21*b* may be connected to a first audio channel of an audio communication system.

Figure 3:
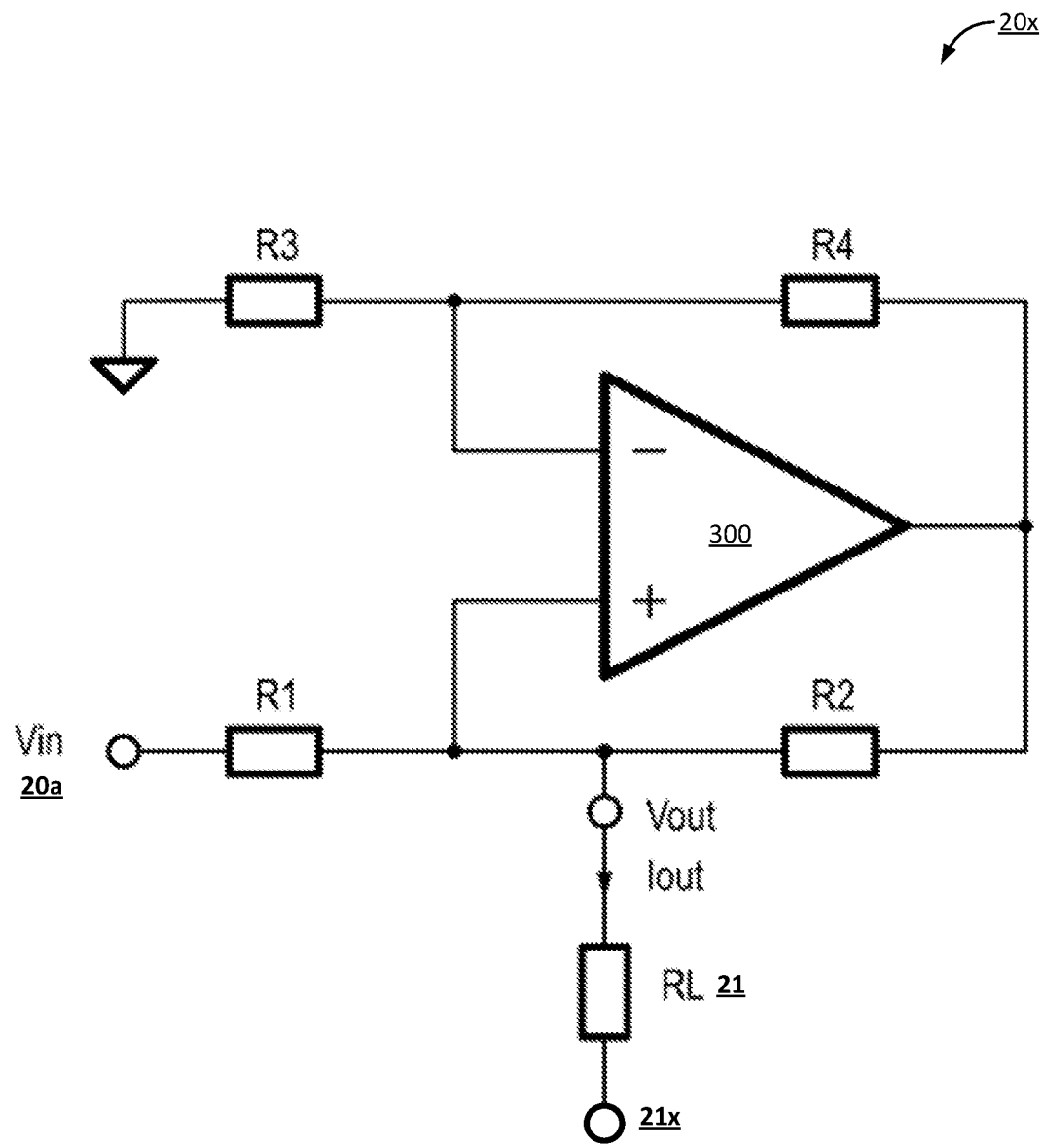
FIG. 3 illustrates a Howland Current Source as may be used by a system to detect termination status in an audio communication system, in accordance with one or more implementations.

By way of non-limiting example, FIG. 3 illustrates an exemplary Howland Current Source 20*x* as may be used by system 100, including resistive load 21, input 20*a* and various other circuit elements as shown, including resistor 1 ("R1"), resistor 2 ("R2"), resistor 3 ("R3"), resistor 4 ("R4"), and operation amplifier 300. Resistive load 21 may be connected to a connection 21*x*, which may be the same as or similar to connection 21*b* as shown in FIG. 1. This circuit and similar circuits have been known for a long time. Howland Current Source 20*x* is a voltage-controlled current source, where typically the ratio of R1/R2 is designed to match the ratio of R3/R4 (e.g., by making all the resistances the same) for desired performance (with the impedance of the output tending towards infinity). Variations and derivative circuits based on Howland Current Source 20*x* or other current sources are envisioned within the scope of this disclosure.

Referring to FIG. 1A, alternating current voltage generator 30 may be configured to generate an alternating current voltage, or AC voltage. In some implementations, the AC voltage generated by alternating current voltage generator 30 may be about 20 Hz, about 30 Hz, between 20-30 Hz, between 10-40 Hz, from about 20 to about 40 Hz, below audible level, and/or other levels, frequencies or ranges of frequencies. In some implementations, the generated AC voltage may form a sinewave. In some implementations, other shapes of waveforms are considered for the generated AC voltage. In some implementations, the generated AC voltage may be used as the input voltage for Current Source 20, e.g., on input 20*a*. In some implementations, the generated AC voltage may be filtered by one or more filters, such as, e.g., filter 16, before being used as the input voltage for Current Source 20. In some implementations, filter 16 may include a low-pass filter. For example, this low-pass filter may filter audible (audio) signals.

First set of one or more filters 12 may be configured to generate a particular output signal, such as an analog output signal. In some implementations, an input of first set of one or more filters 12 may be connected to output 20*b* of Current Source 20. Alternatively, and/or simultaneously, in some implementations, input of first set of one or more filters 12 may be connected to first connection 21*a* of resistive load 21. In some implementations, first set of one or more filters 12 may include a band-pass filter configured to filter direct current signals (also referred to as DC signals). Alternatively, and/or simultaneously, in some implementations, first set of one or more filters 12 may include a low-pass filter configured to filter audible (audio) signals. In some implementations, first set of one or more filters 12 may be preceded or followed by one or more buffers.

Second set of one of more filters 14 may be configured to generate a particular output signal, such as an analog output signal. In some implementations, an input of second set of one or more filters 14 may be connected to a particular audio channel of an audio communication system. Alternatively, and/or simultaneously, in some implementations, input of second set of one or more filters 14 may be connected to second connection 21*b* of resistive load 21. In some implementations, second set of one or more filters 14 may include a band-pass filter configured to filter direct current signals (also referred to as DC signals). For example, some intercom systems use a "CALL" signal that is a DC signal. Alternatively, and/or simultaneously, in some implementations, second set of one or more filters 14 may include a low-pass filter configured to filter audible (audio) signals. In some implementations, second set of one or more filters 14 may be preceded or followed by one or more buffers.

Ratio circuitry 15 may be configured to determine ratios between different signals. For example, ratio circuitry 15 may determine a first ratio between a first analog output signal (from first set of one or more filters 12) and a second analog output signal (from second set of one or more filters 14). In some implementations, ratio circuitry 15 may be configured to determine a ratio between a first magnitude of the first analog output signal (from first set of one or more filters 12) and a second magnitude of the second analog output signal (from second set of one or more filters 14). For example, the first magnitude of the first analog output signal may be determined by the maximum amplitude of the waveform of the first analog output signal. In some implementations, ratio circuitry 15 may be configured to determine ratios between different digital signals (e.g., between a digital version of the first analog output signal and a digital version of the second analog output signal). For example, in certain cases, ratio circuitry 15 may be implemented as a digital circuit, including but not limited to a digital signal processor (DSP) and/or a processor configured by machine-readable instructions to perform the features attributed herein to ratio circuitry 15. In some implementations, some or all functionality attributed to ratio circuitry 15 may be integrated in microcontroller 40.

Status circuitry 17 may be configured to determine the termination status based on an output or result of ratio circuitry 15. For example, status circuitry 17 may determine the termination status based on a ratio provided by ratio circuitry 15. In some implementations, status circuitry 17 may determine the termination status based on one or more comparisons with the ratio provided by ratio circuitry 15. For example, in some implementations, a ratio between 2 and 2.5 may indicate exactly one termination circuit is connected to party line 10. For example, in some implementations, a ratio below 1.5 may indicate exactly no termination circuits are connected to party line 10. For example, in some implementations, a ratio above 2.5 may indicate more than one termination circuit is connected to party line 10. For example, in some implementations, a ratio between 3 and 3.5 may indicate two termination circuits are connected to party line 10. For example, in some implementations, a ratio between 4 and 4.5 may indicate three termination circuits are connected to party line 10. In some implementations, status circuitry 17 may be configured to distinguish between zero, one, or more than one termination circuit being connected to party line 10, e.g., based on one or more comparisons using the ratio provided by ratio circuitry 15. In some implementations, status circuitry 17 may be configured to indicate the termination status through one or more light-emitting diodes such as LEDs 51-52-53 (depicted in FIG. 1B). In some implementations, status circuitry 17 may be configured to control one or more light-emitting diodes such as LEDs 51-52-53 (depicted in FIG. 1B), to indicate a particular termination status. In other implementations, the termination status may be indicated on a user interface or display of a computing device.

In some implementations, status circuitry 17 may be configured to operate on digital signals. For example, in certain cases, status circuitry 17 may be implemented as a digital circuit, including but not limited to a digital signal processor (DSP) and/or a processor configured by machine-readable instructions to perform the features attributed herein to status circuitry 17. In some implementations, some or all functionality attributed to status circuitry 17 may be integrated in microcontroller 40.

In some implementations, system 100 may include one or more analog-to-digital converters configured to convert analog signals to digital signals. For example, a first analog-to-digital converter may be configured to convert a first analog output signal (from first set of one or more filters 12) into a first digital signal. For example, a second analog-to-digital converter may be configured to convert a second analog output signal (from second set of one or more filters 14) into a second digital signal. In some implementations, ratio circuitry 15 may operate on the first digital signal and the second digital signal. In some implementations, microcontroller 40 may operate on the first digital signal and the second digital signal. In some implementations, the functionality of one or more analog-to-digital converters may be included in microcontroller 40. In some implementations, the functionality of filters 12 and 14 may be included in microcontroller 40.

Microcontroller 40 may be configured to generate an alternating current voltage, or AC voltage. In some implementations, some or all functionality attributed to alternating current voltage generator 30 may be integrated in microcontroller 40. In some implementations, some or all functionality attributed to ratio circuit 15 may be integrated in microcontroller 40. In some implementations, some or all functionality attributed to status circuit 17 may be integrated in microcontroller 40. In some implementations, control of one or more light-emitting diodes such as LEDs 51-52-53 may be integrated in microcontroller 40. See, for example, FIG. 1B.

Filter 16 may be configured to filter an output of alternating current voltage generator 30. Alternatively, and/or simultaneously, filter 16 may be configured to filter the input voltage for (input 20a of) Current Source 20. In some implementations, filter 16 may include a low-pass filter. For example, this low-pass filter may filter audible (audio) signals. In some implementations, filter 16 may be preceded or followed by one or more buffers. In some implementations, the functionality of filter 16 may be implemented in microcontroller 40.

One or more light-emitting diodes (LEDs) such as LEDs 51-52-53 may be configured to indicate termination status as determined by, e.g., status circuitry 17. For example, first light-emitting diode 51 may indicate no termination circuit is connected to party line 10. For example, second light-emitting diode 52 may indicate exactly one termination circuit is connected to party line 10. For example, third light-emitting diode 53 may indicate that two or more termination circuits are connected to party line 10. In some implementations, one or more light-emitting diodes may indicate a true/false result whether exactly one termination circuit is connected to party line 10.

In some implementations, system 100 may be integrated in a main station of an audio communication system. In some implementations, system 100 may be integrated in a stand-alone tool intended to operate anywhere in an audio communication system. For example, the audio communication system may be a wired multi-channel intercom system.

Figure 2:
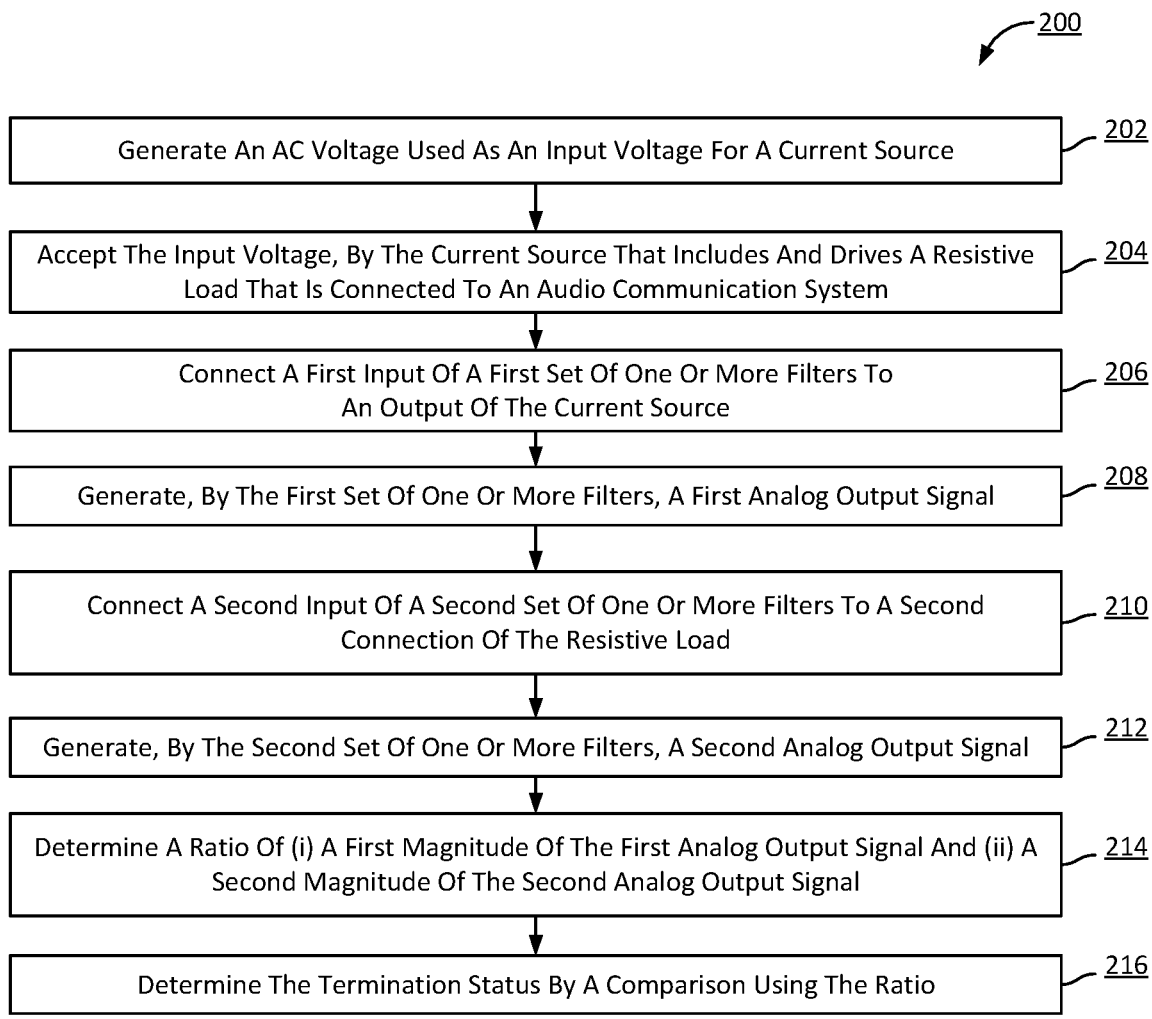
FIG. 2 illustrates a method for detecting termination status in an audio communication system, in accordance with one or more implementations.

FIG. 2 illustrates a method 200 of detecting termination status in an audio communication system, wherein termination status indicates whether exactly one termination circuit is connected to an individual party line, in accordance with one or more implementations. The operations of method 200 presented below are intended to be illustrative. In some implementations, method 200 may be accomplished with one or more additional operations not described, and/or without one or more of the operations discussed. Additionally, the order in which the operations of method 200 are illustrated in FIG. 2 and described below is not intended to be limiting.

In some implementations, method 200 may be implemented in one or more processing devices (e.g., a digital processor, an analog processor, a digital circuit designed to process information, an analog circuit designed to process information, a circuit that is partially analog and partially digital, a state machine, and/or other mechanisms for electronically processing information). The one or more processing devices may include one or more devices executing some or all of the operations of method 200 in response to instructions stored electronically on an electronic storage medium. The one or more processing devices may include one or more devices configured through hardware, firmware, and/or software to be specifically designed for execution of one or more of the operations of method 200.

At an operation 202, an AC voltage is generated. The AC voltage is used to create the input voltage for a voltage-controlled Current Source. In some embodiments, operation 202 is performed by an alternating current voltage generator the same as or similar to alternating current voltage generator 30 (shown in FIG. 1A and described herein).

At an operation 204, the input voltage is accepted, e.g., by the Current Source (CS) that includes and drives a resistive load having a first connection and a second connection. Furthermore, at the same operation, a voltage differential is created between the first and second connections of the resistive load. The second connection of the resistive load is connected to the first audio channel of the audio communication system. The Current Source has an output connected to the first connection of the resistive load. In some embodiments, operation 202 is performed by a voltage-controlled current source the same as or similar to Current Source 20 (shown in FIG. 1A and described herein).

At an operation 206, a first input of a first set of one or more filters is connected to the output of the Current Source. In some embodiments, operation 206 is performed by one or more filters the same as or similar to first set of one or more filters 12 (shown in FIG. 1A and described herein).

At an operation 208, a first analog output signal is generated. In some embodiments, operation 208 is performed by one or more filters the same as or similar to first set of one or more filters 12 (shown in FIG. 1A and described herein).

At an operation 210, a second input of a second set of one or more filters is connected to the second connection of the resistive load. In some embodiments, operation 210 is performed by one or more filters the same as or similar to second set of one or more filters 14 (shown in FIG. 1A and described herein).

At an operation 212, a second analog output signal is generated. In some embodiments, operation 212 is performed by one or more filters the same as or similar to second set of one or more filters 14 (shown in FIG. 1A and described herein).

At an operation 214, a ratio is determined of (i) a first magnitude of the first analog output signal and (ii) a second magnitude of the second analog output signal. In some embodiments, operation 214 is performed by a circuitry the same as or similar to ratio circuitry 15 (shown in FIG. 1A and described herein).

At an operation 216, the termination status is determined by a comparison using the ratio. In some embodiments, operation 216 is performed by a circuitry the same as or similar to circuitry 17 (shown in FIG. 1A and described herein).

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

What is claimed is:

1. A system configured to detect termination status in an audio communication system having a first audio channel, wherein termination status indicates whether exactly one termination circuit is part of the first audio channel of the audio communication system, the system comprising:
   a Current Source (CS) that includes and drives a resistive load ($R_L$) having a first connection and a second connection, wherein the Current Source has an input configured to accept an input voltage, wherein the Current Source is configured to create a voltage differential between the first and second connections of the resistive load, wherein the second connection of the resistive load is connected to the first audio channel of the audio communication system, wherein the Current Source has an output connected to the first connection of the resistive load, and wherein the Current Source is a voltage-controlled Current Source;
   an alternating current (AC) voltage generator configured to generate an AC voltage, wherein the AC voltage is used to create the input voltage for the Current Source;
   a first set of one or more filters having a first input, wherein the first input is connected to the output of the Current Source, and wherein the first set of one or more filters is configured to generate a first analog output signal;
   a second set of one or more filters having a second input, wherein the second input is connected to the second connection of the resistive load, and wherein the second set of one or more filters is configured to generate a second analog output signal;
   first circuitry configured to determine a ratio of (i) a first magnitude of the first analog output signal and (ii) a second magnitude of the second analog output signal; and
   second circuitry configured to determine the termination status by a comparison using the ratio.

2. The system of claim 1, wherein the second circuitry is configured to distinguish between zero, one, or more than one termination circuit being part of the audio communication system, based on one or more comparisons using the ratio.

3. The system of claim 1, wherein the second circuitry is further configured to indicate the termination status through one or more light-emitting diodes.

4. The system of claim 1, wherein the AC voltage generator is a microcontroller.

5. The system of claim 4, further comprising:
   a first analog-to-digital-converter configured to convert the first analog output signal into a first digital signal; and
   a second analog-to-digital-converter configured to convert the second analog output signal into a second digital signal,
   wherein the first circuitry is integrated in the microcontroller and configured to determine the ratio digitally, using the first digital signal and the second digital signal.

6. The system of claim 5, wherein the second circuitry is integrated in the microcontroller.

7. The system of claim 1, wherein the first set of one or more filters includes a band-pass filter configured to filter direct current signals and a low-pass filter configured to filter audible signals.

8. The system of claim 1, wherein the system is integrated in a main station of the audio communication system.

9. The system of claim 1, wherein the AC voltage forms a sinewave having a frequency between 10 and 40 Hz.

10. The system of claim 1, wherein the audio communication system is a wired multi-channel intercom system, and wherein the current source is a Howland Current Source.

11. A method of detecting termination status in an audio communication system having a first audio channel, wherein termination status indicates whether exactly one termination circuit is part of the first audio channel of the audio communication system, the method comprising:
   generating, by an alternating current (AC) voltage generator, an AC voltage, wherein the AC voltage is used to create an input voltage for a Current Source (CS), wherein the Current Source is a voltage-controlled Current Source;

accepting the input voltage, by the Current Source (CS) that includes and drives a resistive load ($R_L$) having a first connection and a second connection, and creating, by the Current Source, a voltage differential between the first and second connections of the resistive load, wherein the second connection of the resistive load is connected to the first audio channel of the audio communication system, and wherein the Current Source has an output connected to the first connection of the resistive load;

connecting a first input of a first set of one or more filters to the output of the Current Source;

generating, by the first set of one or more filters, a first analog output signal;

connecting a second input of a second set of one or more filters to the second connection of the resistive load;

generating, by the second set of one or more filters, a second analog output signal;

determining a ratio of (i) a first magnitude of the first analog output signal and (ii) a second magnitude of the second analog output signal; and determining the termination status by a comparison using the ratio.

12. The method of claim 11, wherein determining the termination status is by circuitry that distinguishes between zero, one, or more than one termination circuit being part of the audio communication system, based on one or more comparisons using the ratio.

13. The method of claim 11, further comprising:
indicating the termination status through one or more light-emitting diodes.

14. The method of claim 11, wherein the alternating current (AC) voltage generator is a microcontroller.

15. The method of claim 14, further comprising:
converting, by a first analog-to-digital-converter, the first analog output signal into a first digital signal; and
converting, by a second analog-to-digital-converter, the second analog output signal into a second digital signal,
wherein the microcontroller determines the ratio digitally, using the first digital signal and the second digital signal.

16. The method of claim 15, wherein the microcontroller determines the termination status.

17. The method of claim 11, wherein the first set of one or more filters includes a band-pass filter that filters direct current signals and a low-pass filter that filters audible signals.

18. The method of claim 11, being implemented by and integrated in a main station of the audio communication system.

19. The method of claim 11, wherein the AC voltage forms a sinewave having a frequency between 10 and 40 Hz.

20. The method of claim 11, wherein the audio communication system is a wired multi-channel intercom system, and wherein the current source is a Howland Current Source.

* * * * *